United States Patent [19]

Wada

[11] Patent Number: 5,001,078
[45] Date of Patent: Mar. 19, 1991

[54] METHOD OF MAKING SEMICONDUCTOR MEMORY DEVICE

[75] Inventor: Masashi Wada, Yokohama, Japan

[73] Assignee: Kabushiki Kaisha Toshiba, Kawasaki, Japan

[21] Appl. No.: 389,417

[22] Filed: Aug. 4, 1989

Related U.S. Application Data

[62] Division of Ser. No. 837,881, Mar. 10, 1986.

[30] Foreign Application Priority Data

Apr. 16, 1985 [JP] Japan .................................. 60-80619

[51] Int. Cl.[5] .................... H01L 21/70; H01L 27/108
[52] U.S. Cl. ........................................ 437/52; 437/47; 437/60; 437/919
[58] Field of Search ...................... 437/38, 47, 52, 60, 437/203, 228, 233, 235, 919; 357/23.6, 51; 365/186, 174

[56] References Cited

U.S. PATENT DOCUMENTS

| | | | |
|---|---|---|---|
| 4,199,772 | 4/1980 | Natori et al. | 357/23.6 |
| 4,630,088 | 12/1986 | Ogura et al. | 357/23.6 |
| 4,679,300 | 1/1987 | Chan et al. | 357/23.6 |
| 4,737,829 | 4/1988 | Morimoto et al. | 357/23.6 |
| 4,769,786 | 9/1988 | Garnache et al. | 357/23.6 |

FOREIGN PATENT DOCUMENTS 0176254 4/1986 Japan .

*Primary Examiner*—Brian E. Hearn
*Assistant Examiner*—T. Thomas
*Attorney, Agent, or Firm*—Oblon, Spivak, McClelland, Maier & Neustadt

[57] ABSTRACT

Island layers defined by grooves are formed on a $p^+$-type silicon substrate. One memory cell having a MOS capacitor and a MOSFET transistor is formed in each island layer. The MOS capacitor is buried in a groove surrounding the island layer and has a capacitor electrode insulatively provided over the bottom surface of the groove and an $n^-$-type semiconductor layer formed in a ring-shaped manner in the side surface region of the groove and facing the capacitor electrode. The MOSFET has a ring-shaped gate electrode for in the groove to be insulatively stacked over the capacitor electrode. The gate electrode faces a p-type channel region formed in a ring-shaped manner in the side surface region of the island layer. Only a drain layer is formed in the top surface region of the island layer.

23 Claims, 8 Drawing Sheets

METHOD OF MAKING SEMICONDUCTOR MEMORY DEVICE

This is a division of application Ser. No. 06/837,881, filed on Mar. 10, 1986.

BACKGROUND OF THE INVENTION

The present invention relates to semiconductor memory devices and, more particularly, to a dynamic semiconductor memory device each cell of which consists of a transistor and a capacitor.

Dynamic random access memories (to be referred to as dRAMs hereinafter) are represented by a MOS dRAM having cells each consisting of a MOS capacitor and a MOS transistor (MOSFET). In dRAMs of this type, "1" or "0" digital data is stored in accordance with whether a charge is stored in its MOS capacitor or not. This data is read out by discharging the charge stored in the MOS capacitor of a selected cell to a corresponding bit line through a MOSFET and detecting a change in the potential of that bit line.

Increasing demands have arisen recently for a dRAM which has a large memory capacity. A dRAM can have a large memory capacity when packing density (i.e., density of memory cells) in chips of the same size is increased. The packing density of MOS dRAMs has been greatly improved due to new developments in recent semiconductor manufacturing techniques, particularly in micropatterning. As a result, it may be considered that a dRAM having a large memory capacity can be easily obtained by decreasing cell size on a chip substrate and increasing cell density.

However, when the cell size is just decreased, operational reliability of the dRAM is degraded. This is because the decrease in cell size also decreases its possible charging amount, which leads to degradation in the element characteristics. In other words, when the cell size is decreased, the size of a MOS capacitor in the cell is also decreased, resulting in a decrease in the capacitance of the MOS capacitor. Therefore, when the charging amount becomes less than a minimum level (required lower limit of the possible charging amount, determined by the operation margin of the cell and a margin against noise caused by incident $\alpha$ rays), basic cell characteristics are degraded. For this reason, miniaturization of the cell size, i.e., micropatterning of the dRAM, is limited.

The charging amount of the cell capacitor depends not only on the capacitance of the MOS capacitor but also on the value of the voltage applied thereto. It is theoretically possible to improve the charging amount of the cell capacitor by increasing the voltage applied thereto. In practice, however, increase in the applied voltage is not preferred since it requires increase in the power source voltage of the dRAM, which results in an increase in power consumption.

As methods for preventing decrease in the capacitance of the cell capacitor in manufacturing a dRAM with a large capacitance, the following three methods may be proposed:

(1) to decrease the thickness of the gate insulating film;

(2) to increase dielectric constant e of the gate insulating film; or (3) to increase the area of the capacitor electrode.

Among these, method (1) is limited in its application to a dRAM manufacturing process since the thickness of the gate insulating layer cannot be decreased drastically without degrading the reliability of the element characteristics. Therefore, method (1) cannot be adopted. In method (2), an insulating material having large dielectric constant $\epsilon$ would be used in place of silicon oxide ($SiO_2$), which is currently under widespread use. However, no insulating material has yet been found which satisfies the above conditions and which can replace silicon oxide (a silicon compound such as $Si_3N_4$ may be proposed as a substitute, but there are inherent problems in using such a compound in the mass production of highly reliable dRAMs.) Therefore, method (2) cannot be adopted, either. As a result, in order to increase the capacitance of the cell capacitor, method (3), i.e., a method to increase the area of the capacitor electrode, must be adopted.

In order to increase the area of the capacitor electrode without decreasing the packing density of the dRAM, cell capacitors are conventionally formed in grooves for separating cell regions on a substrate. More specifically, the cell capacitors are formed not on the cell regions defined by the grooves but in the grooves surrounding the island cell regions. In this case, the electrode of each cell capacitor also extends vertically along a recessed section of the groove. Therefore, the area of the capacitor electrode is substantially increased despite the small area of the grooves, resulting in great improvements in the effective capacitance of the cell capacitor.

However, in a conventional dRAM having the above arrangement, the area of the cell region is increased, and an expected improvement in higher packing density (larger memory capacity) of the dRAM cannot be obtained. This is because with the above arrangement, the cell transistor is constituted by a gate electrode provided on a periphery of the island cell region and a drain region formed at a central portion of the cell region. Therefore, the area of the MOS transistor in the cell is undesirably increased, and it is still difficult to enable a dRAM having good operational reliability and a large memory capacity (high packing density).

SUMMARY OF THE INVENTION

It is, therefore, an object of the present invention to provide a new and improved semiconductor memory device having a large memory capacity, in which cells having superior electrical characteristics can be formed on a substrate at a high packing density.

According to the semiconductor device of the present invention, a semiconductor substrate of a first conductivity type is provided with grooves. Each memory cell consists of a single capacitor and a single transistor, and the memory cell capacitors are buried in the grooves. Each cell capacitor has a capacitor electrode layer insulatively provided above the bottom surface of the groove, and a semiconductor layer of a second conductivity type formed on a lower surface region of the side wall of one island layer. This semiconductor layer opposes the capacitor electrode layer to store charges therebetween, thereby constituting the memory cell capacitor. The cell transistor is also formed using the side wall of the groove. More specifically, active layers of the transistor are formed to be vertically stacked with the semiconductor layer of the capacitor, using as much of the side wall of the island layer as possible. Only the drain layer of the transistor is formed on the top surface region of the island layer. Other active layers, such as a channel layer, are formed on the surface region of the side wall of the island layer. The gate electrode of the transistor is buried in a corresponding groove so as to oppose the channel layer and be stacked with the capacitor electrode layer. With this arrangement, the memory packing density of the device is increased without decreasing the capacitance of the memory capacitor, thus achieving the above object.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
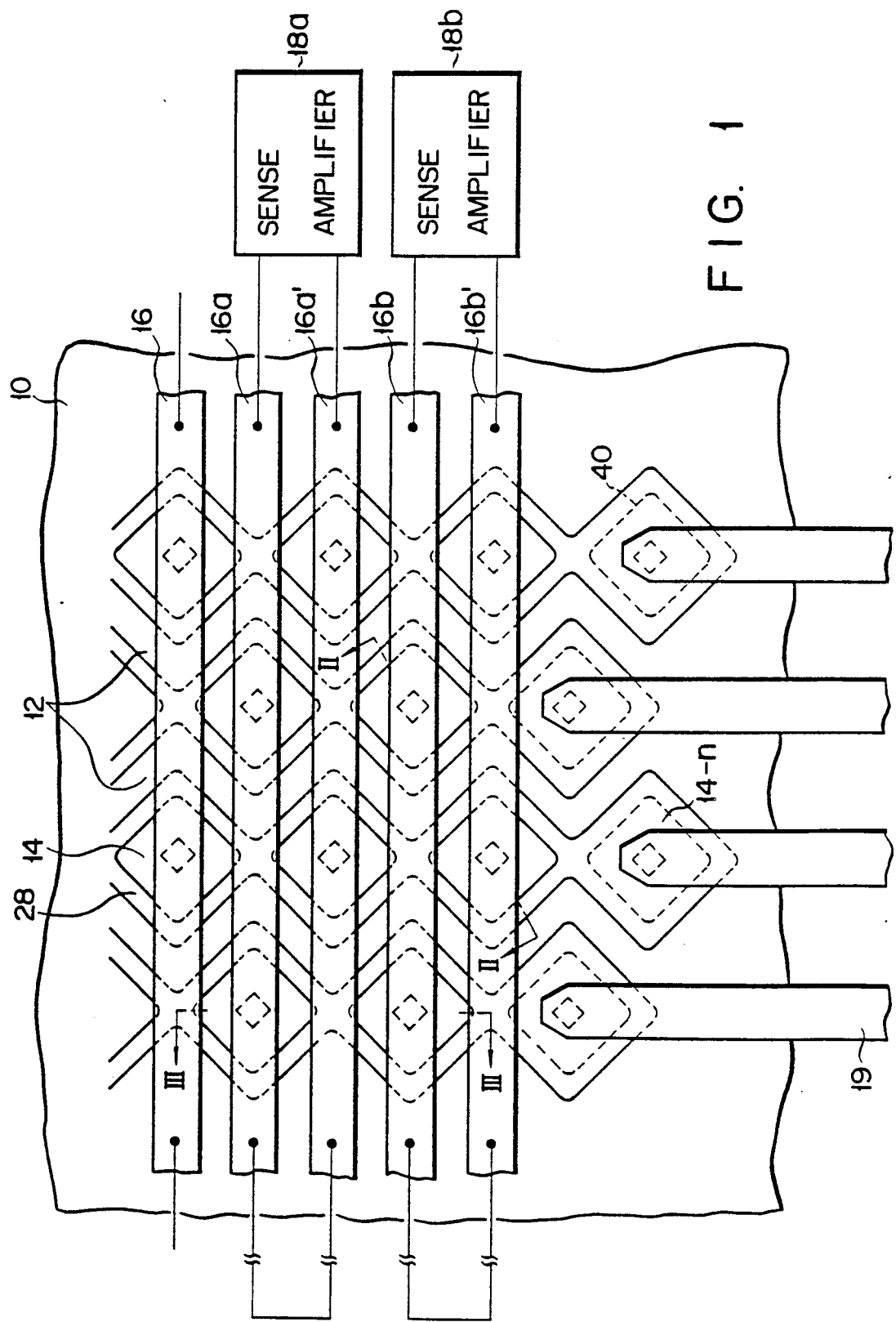
FIG. 1 is a diagram (not drawn to scale) of a dynamic random access memory according to a first embodiment of the present invention, and shows a plan configuration of a main portion of the memory device in which a plurality of island cell regions are aligned on a substrate.

FIG. 1 shows a plan configuration of the main portion of a MOS dynamic random access memory (dRAM) according to one embodiment of the present invention. Note that an oxide film layer and other arrangements obvious to one skilled in the art are omitted in FIG. 1 for the sake of simplicity.

In FIG. 1, substrate 10 is comprised of a $p^+$-type semiconductor material such as silicon. The surface of substrate 10 is provided with a plurality of grooves 12, which define isolated island layers 14. Each layer 14 consists of a $p^-$-type semiconductor material such as silicon. Island layers 14 serve as independent cell regions 14, each of which is shaped in a rectangular parallelepiped so that it has a rectangular (e.g., square) top surface region and four substantially vertical side walls. In this embodiment, one memory cell is provided in each cell region 14.

The dRAM of this embodiment has a so-called "folded bit line arrangement". As shown in FIG. 1, the columns (cells vertically aligned in FIG. 1) of layers 14 are offset alternately by half of the cell pitch. Bit lines 16 extend on the columns of island layers 14 in the row direction (horizontal in FIG. 1) to be substantially perpendicular thereto. Lines 16 connect corresponding island cell regions in every other columns. Two adjacent bit lines (e.g., lines 16a and 16a') are connected to each other as shown in FIG. 1 and serve substantially as a single bit line. Pairs of bit lines 16a and 16a', 16b and 16b', etc., connected to each other are connected to sense amplifiers 18a, 18b, etc. Word lines 19 extending in the column direction (vertical in FIG. 1) are connected to the columns of island cell regions 14.

Figure 2:
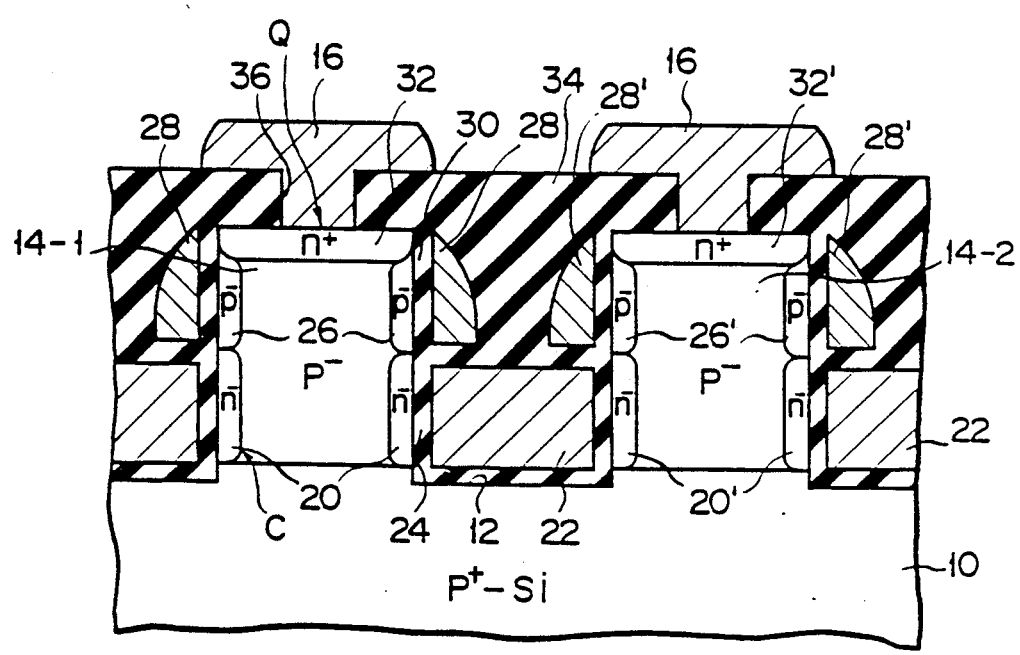
FIG. 2 is a diagram (not drawn to scale) taken along a line II—II of FIG. 1, for showing a sectional arrangement of the memory thereof.

FIG. 2 shows a sectional arrangement of the dRAM taken along the line II—II of FIG. 1, and shows two island cell layers 14-1 and 14-2 included in two adjacent memory cell columns. As mentioned above, one memory cell corresponds to one layer 14 in this embodiment. Each memory cell consists of single metal oxide semiconductor (MOS) capacitor C and field effect transistor MOSFET) Q.

The arrangement of layer 14-1 will now be described in detail (other memory cells not described here have the same arrangements). In FIG. 2, portions of layer 14-2 that are equivalent to those of layer 14-1 are denoted by the same reference numerals with "'", for the sake of simplicity.

$N^-$-type semiconductor layer 20 is formed on the lower half surface region of the side wall of layer 14-1. Layer 20 extends entirely along the side walls of the lower half of layer 14-1 (i.e., to surround the lower half of the four side walls). A conductive layer, such as metal layer 22, is buried in groove 12 at the sides of layer 14-1, so as to oppose layer 20. More specifically, layer 22 is formed in a square shape to surround square layer 20 on its outer side surfaces. The width of layer 22 substantially corresponds to the width of groove 12. The height of metal layer 22 substantially corresponds to the height of layer 20. The height of layer 20 must not be smaller than that of layer 22.

Layer 22 serves as a capacitor electrode of memory cell capacitor C. Insulative layer 24 is filled between layers 20 and 22 to provide a capacitive component therebetween. Layer 22 is integrally formed with the capacitor electrode layers in other memory cells of other layers 14, and constitutes a common capacitor electrode.

$P^-$-type semiconductor layer 26 is formed on the upper half of the side walls of layer 14-1. The impurity concentration of layer 26 is higher than that of layer 14 by about $10^2$. Substantially square-ring-shaped layer 26 extends along the entire side walls of the upper half of layer 14-1 (i.e., to surround the four side walls) and is in electrical contact with layer 20. Layer 26 serves as a channel region of memory cell transistor Q. A conductive layer, such as metal layer 28, is buried in groove 12 so as to oppose and surround layer 26 on its outer side surfaces. Layer 28 commonly surrounds layers 14 in the same cell column and serves as a gate electrode of memory cell transistor Q and a word line within the cell matrix. Insulative layer 30 is filled between layers 26 and 28 to separate them electrically.

Thus, the surface of the side walls of layer 14-1 is covered with two vertically stacked layers 20 and 26. $N^+$-type semiconductor layer 32 is formed in a top surface region of layer 14-1. Layer 32 covers the entire surface of layer 14-1 and functions as a drain layer of cell transistor Q. With this transistor arrangement, layer 20 of capacitor C described above also serves as a source layer of transistor Q.

Insulative layer 34 made of a CVD oxide film is formed to bury the above arrangement. Layer 34 is provided with contact hole 36 at substantially the central portion of each drain layer 32 formed in the top surface of each layer 14. Bit lines 16 shown in FIG. 1 consist of a plurality of aluminum layers and extend parallel to each other to connect holes 32. Thus, drain layers 32 of cell transistors Q, aligned in the row direction (horizontal in FIG. 1) of every other cell columns (i.e., vertical cell arrays in FIG. 1), are connected to each other through corresponding bit lines 16.

Figure 3:
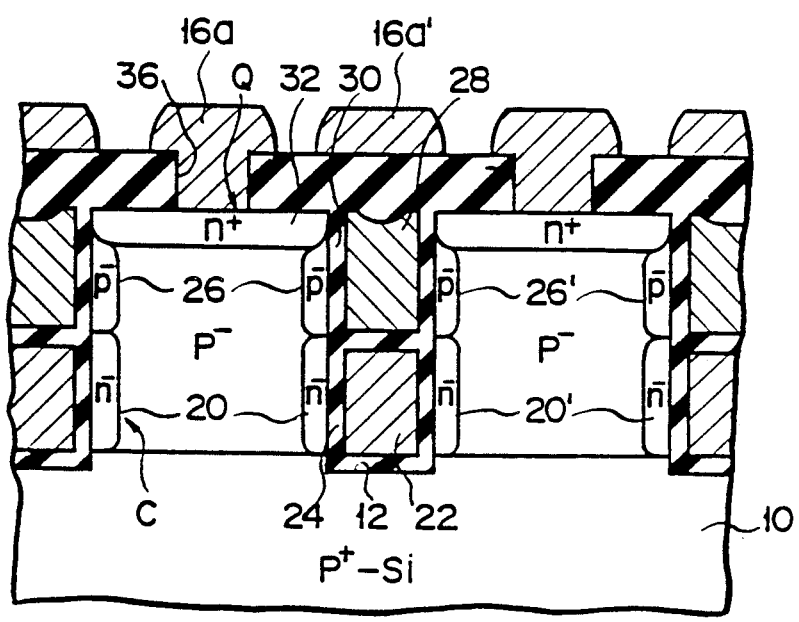
FIG. 3 is a diagram (not drawn to scale) taken along a line III—III of FIG. 1, for showing a sectional arrangement of the memory thereof.

Referring to FIG. 3, a sectional arrangement of adjacent layers 14 in a single cell column is shown in detail. It is clearly understood from FIG. 3 that gate electrode layers 28 for MOSFETs of cells in the same column are connected in common with each other. Single gate electrode layer 28 is buried in groove 12 to simultaneously surround channel regions 26 and 26' formed in the side walls of adjacent island cell layers 14, as shown in FIG. 3.

Referring to FIG. 1, in island cell layer 14 (e.g., layer 14-n) at a last stage directly connected to word lines 19 outside the cell matrix, layer 28 serving as the gate electrode layer is formed (in an inverted container manner) so as to not only surround the four side walls of each island layer 14 but to also cover the top surface thereof, as indicated by broken line 40 in FIG. 1. An insulating layer (not shown), having an identical hole to layer 34 with hole 36, is formed on gate electrode layer 28. Each word line 19 overlaps this contact hole in the insulating layer of last layer 14 in each column. Thus, respective word lines 19 outside the cell matrix are electrically connected to gate layers 28 of last layers 14 in columns.

In the dRAM according to the first embodiment of the present invention described above, not only cell capacitors C but also most of cell transistors Q are located in grooves 12, using the side walls of isolated layers 14. Only drain layer 32 of transistor Q is formed on the top surface region of each layer 14. Accordingly, the area of each layer 14 can be smaller than that in a conventional arrangement and the number of layers 14 on one chip substrate 10 can be greatly increased. As a result, the packing density of the memory can be improved, enabling a dRAM having a large memory capacity. The present inventor experimentally manufactured an actual dRAM having a memory capacity about four times that of a conventional dRAM, on the same chip size.

Particularly careful attention must be paid to the fact that the capacitance of cell capacitor C is not impaired upon improvement in the packing density of the memory. This is because the effective electrode area of capacitors C buried in grooves 12 defining layers 14 is not at all influenced by decrease in the area of the layers 14. Since the effective electrode area of cell capacitors C is not decreased, the capacitance thereof can be made as large as is required, based on high reliability of the memory. As a result, a dRAM having high operating reliability as well as large memory capacity can be provided.

In addition, according to the present invention, cell transistors Q as well as cell capacitors C are partially buried in grooves 12 (specifically, the gate electrodes are formed therein), so that the surface configuration of the dRAM can be flattened. Thus, fine wiring patterns can be manufactured easily in subsequent wiring steps. This contributes to higher packing density and further improvement in reliability of the dRAM having a large memory capacity.

A method of manufacturing the dRAM shown in FIGS. 1 to 3 will be described with reference to FIGS. 4A to 4H. FIGS. 4A to 4G correspond to a section taken along the line III—III of FIG. 1 and respectively show structures obtained in major steps of the manufacturing method according to the present invention. The same reference numerals in FIGS. 4A to 4H denote the same parts as in FIGS. 1 to 3.

Figure 4C:
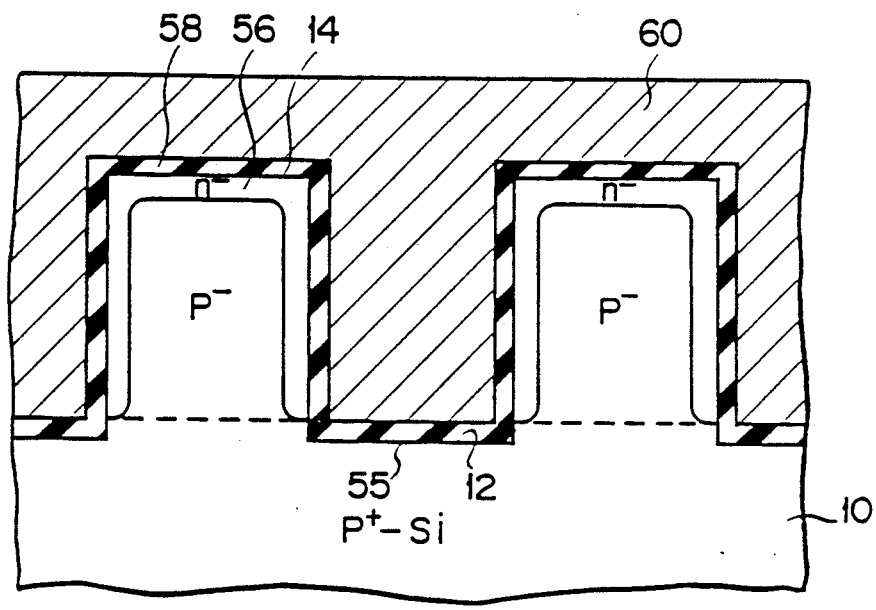
FIGS. 4A to 4H are diagrams (not drawn to scale), for respectively showing the sectional arrangement of the main portion of the device in major steps of a method of manufacturing the memory of FIG. 1.
Figure 4D:
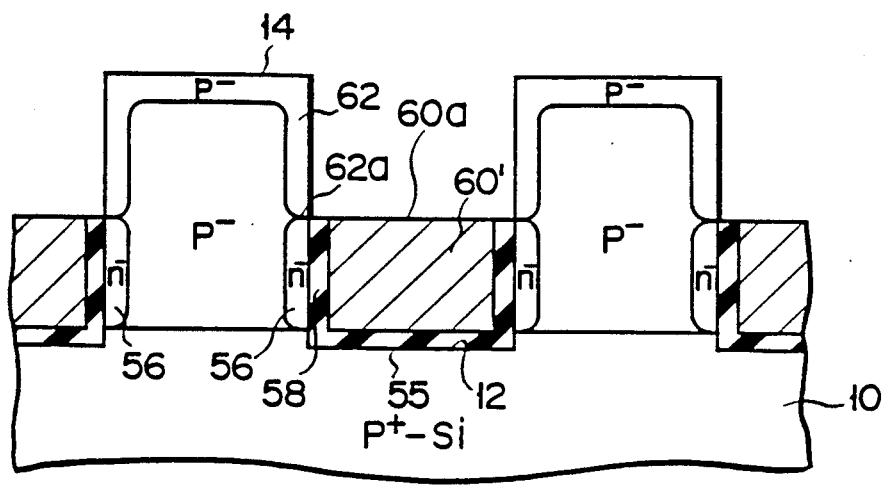
Figure 4A:
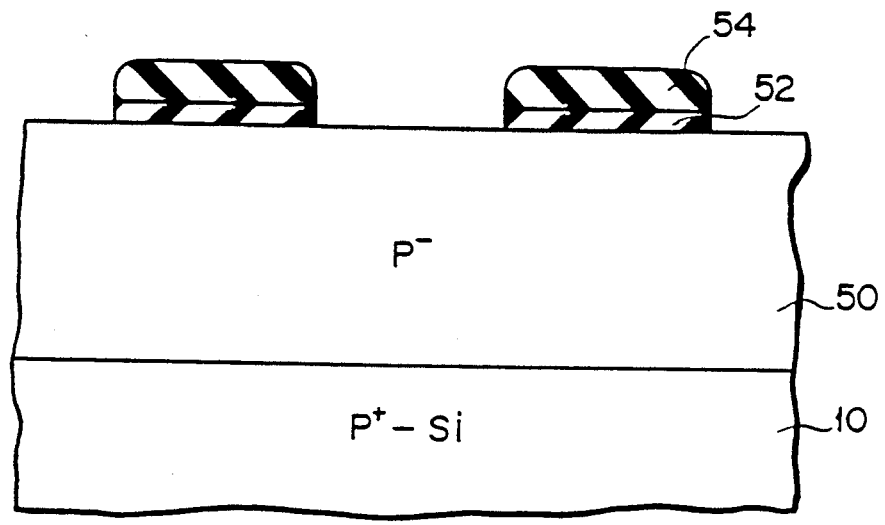

Referring to FIG. 4A, $p^-$-type semiconductor layer 50 is epitaxially grown on $p^+$-type silicon substrate 10. Mask layer 52 is deposited on layer 50, and photoresist film 54 is deposited thereon. Film 54 is patterned to have a predetermined pattern by a known method and layer 52 is etched using film 54 as a mask, thereby obtaining the structure shown in FIG. 4A.

Figure 4B:
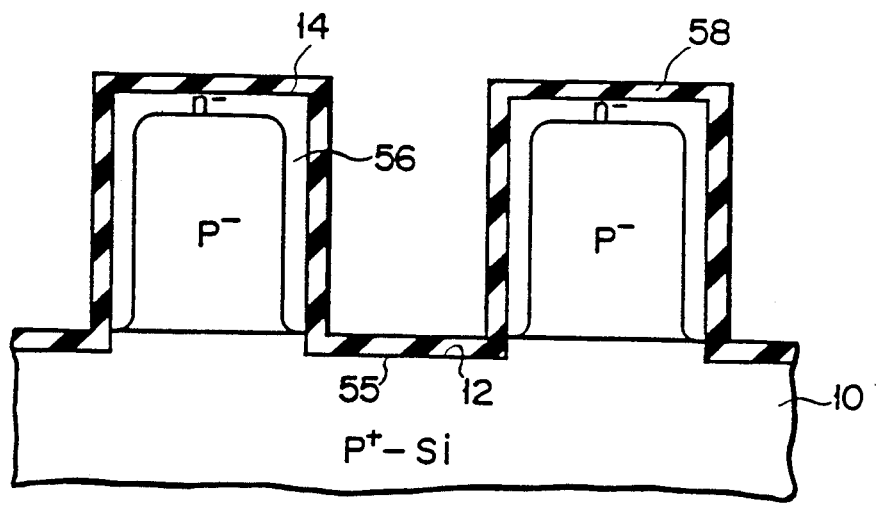

Layer 50 is etched using layer 52 shown in FIG. 4A so that grooves 12 defining a plurality of island cell layers 14 are formed on layer 50, as shown in FIG. 4B. Grooves 12 completely penetrate layer 50 to reach the upper surface of substrate 10. In this embodiment, grooves 12 are formed to extend into the upper surface region of substrate 10. The depth of recess 55 thus formed in substrate 10 substantially corresponds to the thickness of an insulative layer (58) to be formed later. An oxide film containing phosphorous is deposited on the entire surface of the substrate body having the above configuration. The oxide film is annealed to form $n^-$-type layer 56 (which serves as semiconductor layer 20 afterwards constituting cell capacitor C) on the entire surface region around each layer 14. Thereafter, thin oxide film 58 of about 10 nm is formed to cover each layer 14. Note that film 58 is also formed in recess 55 and is thus flush with the upper surface of substrate 10. This maximizes of the capacitance of cell capacitor C.

Subsequently, first polycrystalline silicon layer 60 is deposited on the entire surface of the structure described above, thereby completely burying layer 14, as shown in FIG. 4c, and the upper surface of layer 60 is flattened. Layer 60 is then etched to substantially remove the upper half thereof. As a result, as shown in FIG. 4D, polycrystalline silicon layer 60' is formed in groove 12 between layers 14 on substrate 10 to bury part of layers 14. Layer 60' provided at the bottom of grooves 12 serves as capacitor electrode 22 previously mentioned. Because of the presence of recess 55 formed on the upper surface of substrate 10, the lower surface of layer 60' is substantially level with lower surface of layer 56 of layer 14. If recess 55 were not formed in substrate 10, the lower surface of the layer 60' would be higher than that of layer 56 because of insulative film 58 deposited on substrate 10, and the opposing areas of layers 60 and 56 would be decreased by the difference in height, resulting in a decrease in the capacitance of cell capacitor C.

Substantially the upper half of layer 14 is exposed by layer 60' formed in groove 12 as shown in FIG. 4D. An oxide film containing boron is deposited on the exposed upper portion of layer 14 and annealed to form $p^-$-type semiconductor layer 62. In other words, $n^-$-type layer 56 on the upper portion of exposed layer 14 is converted to $p^-$-type layer 62 by thermal annealing. Layer 62 serves as channel region 26 of cell transistor Q.

Referring to FIG. 4D, lower end 62a of layer 62 is flush with upper surface 60a of layer 60'. In the actual manufacturing process, however, when only the processing described above is performed, the upper portion of layer 56 formed in advance is set back by lateral diffusion of an impurity in layer 14 during formation of layer 62. Thus, lower end 62a of layer 62 cannot be correctly aligned with upper surface 60a of layer 60'. In order to prevent this, the thickness of layer 60' must be slightly increased to compensate for an expected set back amount of the upper portion of layer 56, and layer 60 is etched after formation of layer 62. Therefore, even if the upper portion of layer 56 is set back by diffusion of a p-type impurity, lower end 62a of layer 62 can be aligned with upper surface 60a of layer 60' or set higher than upper surface 60a, as needed.

Figure 4E:
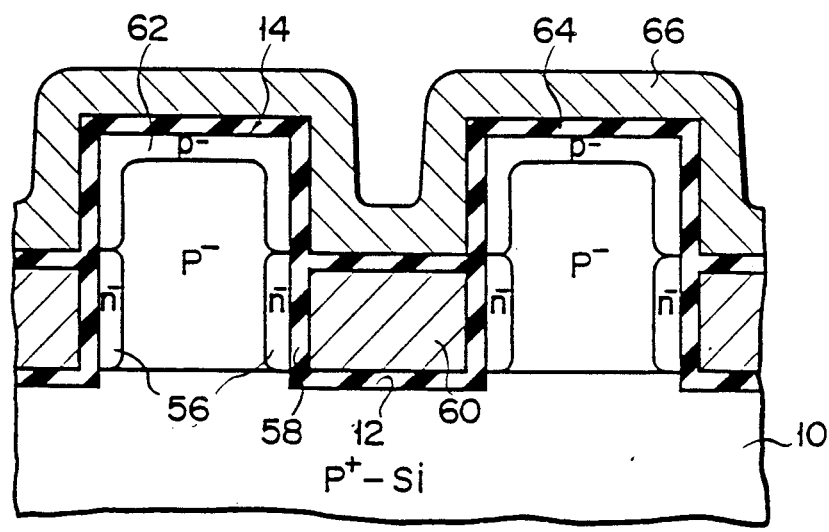

Thereafter, thin oxide film 64 of 20 nm thickness is formed on the entire surface of the structure shown in FIG. 4D so as to cover the exposed upper portion of layer 14, as shown in FIG. 4E. Second polycrystalline silicon layer 66 is deposited on film 64 to a uniform thickness. Second layer 66 serves as gate electrode 28 of cell transistor Q described with reference to FIGS. 1 to 3. Second layer 66 is electrically isolated from first polycrystalline silicon layer 60 and layer 14 by film 64. It should be noted that the upper surface of second layer 66 is not flattened out is uneven to correspond to the shape of layers 14.

Figure 4F:
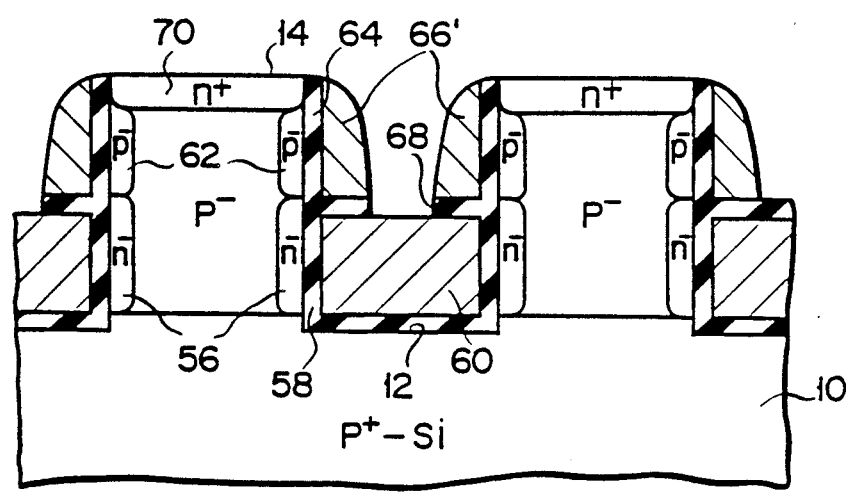

As shown in FIG. 4F, second layer 66 covering the upper half of layers 14 is then etched by anisotropic etching (e.g., reactive ion etching or RIE) to selectively leave only layer components 66' attached on the vertical side wall of each layer 14 in groove 12. The other portions of layer 66 are thus removed. Then, the central portion of film 64 formed on the upper surface of layer 60 provided in each groove 12 is etched using wet etching technique, thereby forming opening 68 and exposing layer 60 therethrough. During the wet etching, a portion of film 64 deposited on the top surface of each layer 14 is also removed, so that the top surface of each layer 14 is exposed, as shown in FIG. 4F. The portion of film 64 may be removed during the anisotropic etching of the layer 66.

Note that etched polycrystalline layer 66' corresponding to layer 28 can be automatically formed without masking. Layers 66' commonly surround layers 14 in a cell array (vertically aligned arrays in FIG. 1) and are separated from each other between layers 14 in adjacent cell arrays. Etched polycrystalline layers 66' (i.e., gate electrode layers 28 in FIG. 1) commonly surrounding layers 14 in each cell array constitute a word line within a cell matrix.

An n-type impurity, such as arsenic, is implanted by a known ion implantation method in the top surface region of each layer 14 to form $n^+$-type semiconductor layer 70. Layer 70 completely covers the upper surface of layer 14, as shown in FIG. 4F, and serves as drain layer 32 of cell transistor Q.

Figure 4G:
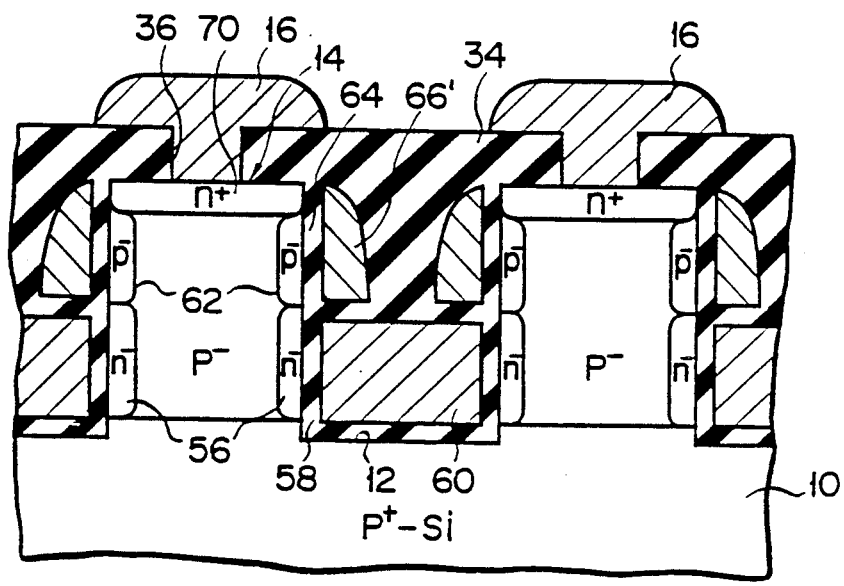

As shown in FIG. 4G, CVD oxide film 34 is deposited on the entire upper surface of the structure shown in FIG. 4F and central portions of film 34 on the top surfaces of layers 14 are etched to obtain contact holes 36. Transistor drain layers 70 are thus exposed through holes 36. A plurality of aluminum bit lines 16, overlapping holes 36 in film 34 and extending parallel to each other as shown in FIG. 1, are formed on film 34. Thus, a dRAM according to the first embodiment of the present invention is completed.

Figure 4H:
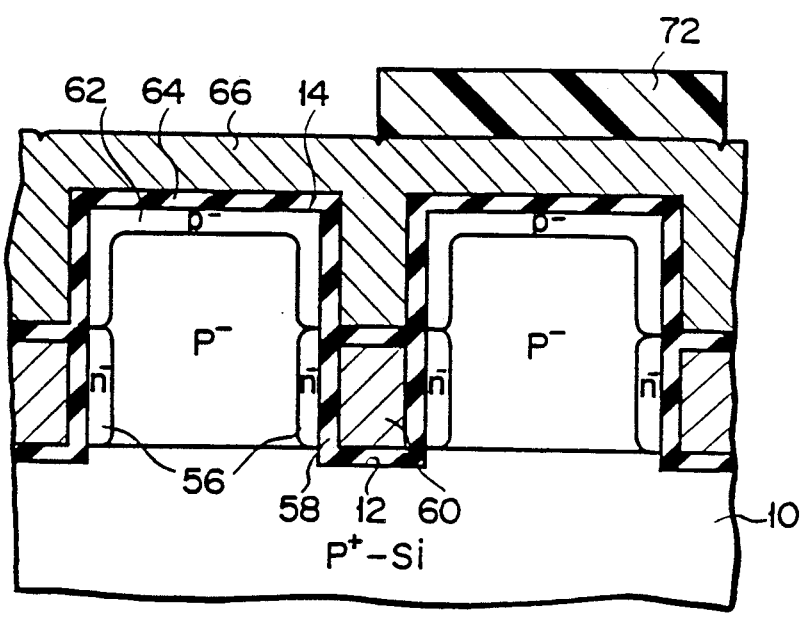

FIG. 4H shows a sectional arrangement of other portions of the dRAM (i.e., last layer 14 in each cell column to which word line 19 is connected directly) in the step shown in FIG. 4E. After second layer 66 is deposited on film 64, photoresist layer 72 is deposited thereon to cover last layer 14-n in each cell column. Thus, during RIE, only the portion of the layer 66 which covers layer 14-n can be prevented from being etched. In other words, while second layer 66 covering most of layers 14 is being etched to form layer 66' (see FIG. 4F) surrounding only the side surfaces of layers 14, only the polycrystalline silicon layer component (covered by layer 72) covering last layer 14-n is not etched but is left. After RIE and after layer 72 is removed, as shown by broken line 40 in FIG. 1, layer 28 (or 66') also covers the upper surface of last layer 14-n. Word line 19 outside the cell matrix is formed directly on layer 28 (or 66') which also covers the upper surface of each layer 14-n. Layer 66' (or 28) of last layer 14-n is brought into electrical contact with line 19 basically in the same manner as that for other layers 14.

According to the manufacturing method described above, a dRAM of the present invention which has a large memory capacity can be easily manufactured without using any special manufacturing technique. In particular, when gate electrode layers 28 surrounding side walls of layers 14 are formed, they can be formed correctly and easily since no mask of a special form is needed.

A dRAM according to the second embodiment of the present invention will be described with reference to FIGS. 5 to 7. According to the first embodiment, one memory cell is formed in each layer 14. However, according to the second embodiment to be described below, two memory cells are formed in each layer 14, so that the memory packing density is further improved. The two-dimensional configuration of the memory cell is apparent from FIG. 5. The same reference numerals in FIGS. 5 to 7 denote the same parts as in the first embodiment and a detailed description thereof will be omitted.

Figure 5:
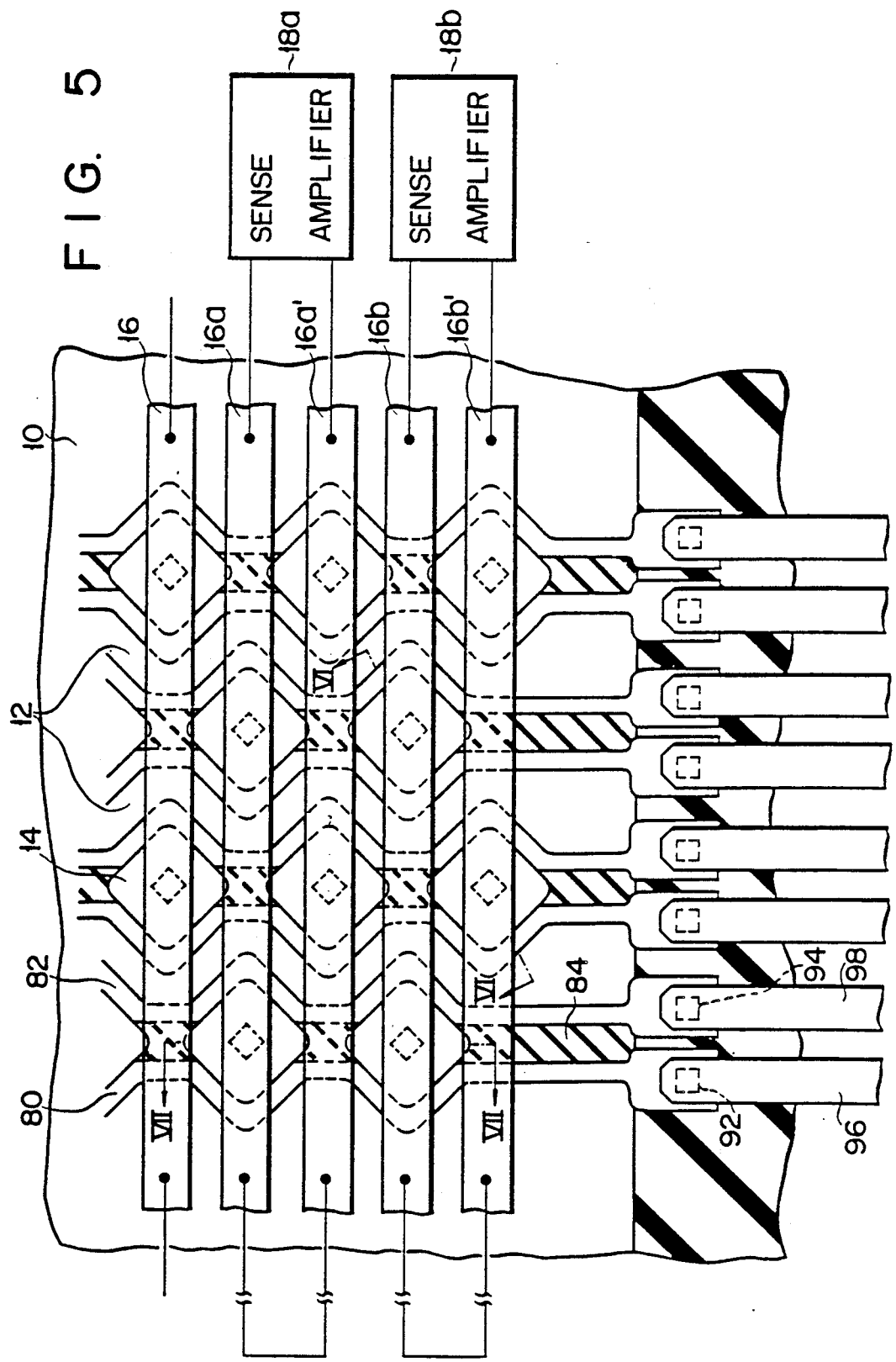
FIG. 5 is a diagram (not drawn to scale) of a dynamic random access memory according to a second embodiment of the present invention, and shows a two-dimensional arrangement of a main portion thereof in which two cells are formed in each island region.

Referring to FIG. 5, the two-dimensional distribution of layers 14 on substrate 10 is basically the same as that of the first embodiment. However, note that two separated gate electrode layers 80 and 82 are provided for each column of cell array (vertically aligned cells in FIG. 5). Field oxide film 84 is buried between layers 80 and 82 in each column of cell array, thereby electrically isolating layers 80 and 82. Film 84 is formed to longitudinally divide gate electrode layers 80 and 82 of the same column along their extending direction in a manner apparent from FIG. 7 (thick broken lines are used in FIG. 5 to indicate portions of films 84 stacked under bit lines 16.) More specifically, two gate electrodes 80 and 82 are provided on both sides of each layer 14 which oppose each other and are insulated from each other by film 84 (see FIG. 6).

Figure 6:
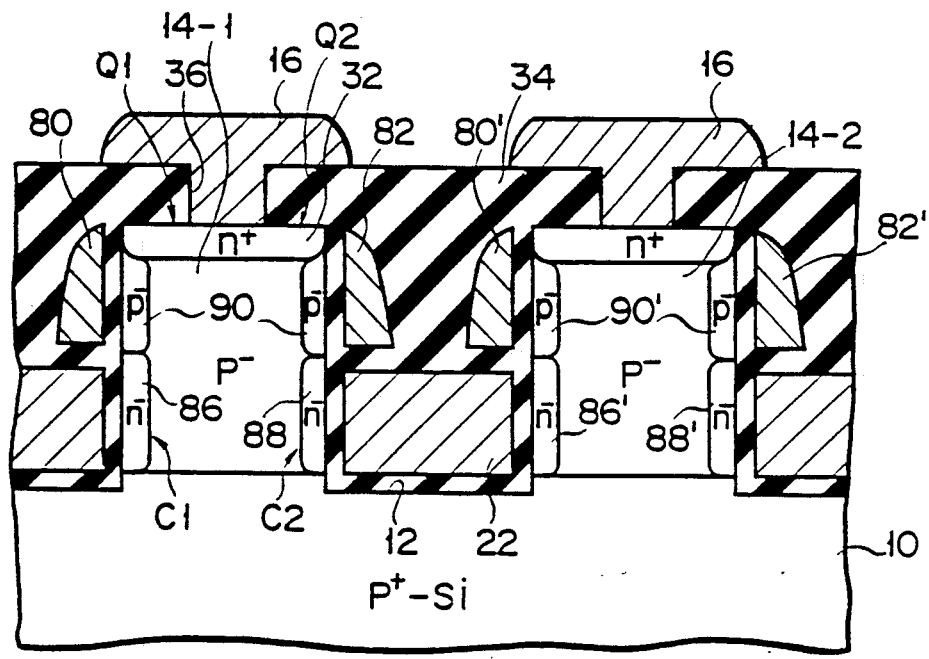
FIG. 6 is a diagram (not drawn to scale) taken along a line VI—VI of FIG. 5, for showing a sectional arrangement of the memory thereof.
Figure 7:
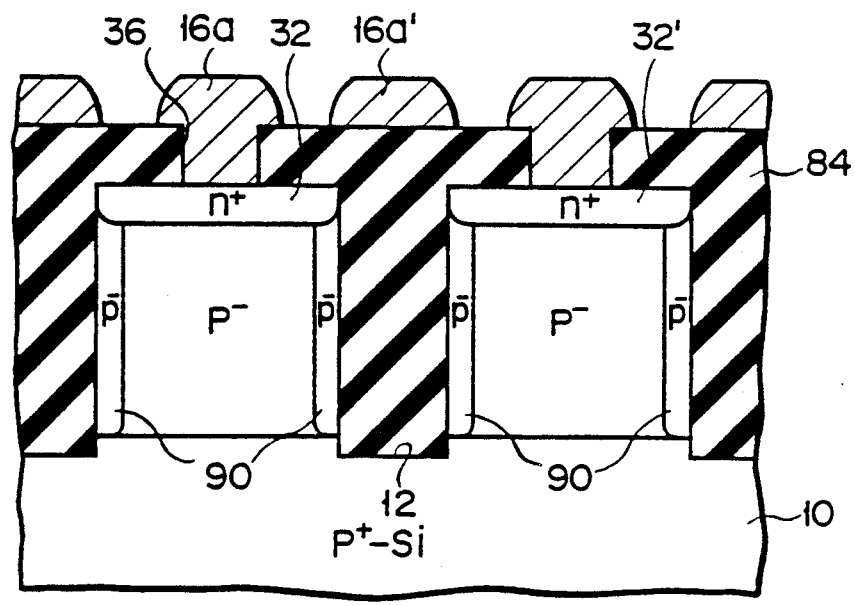
FIG. 7 is a diagram (not drawn to scale) taken along a line VII—VII of FIG. 1, for showing a sectional arrangement of the memory thereof.

Referring to the sectional arrangement of the dRAM in FIG. 6 taken along the line VI—VI of FIG. 5, capacitor electrode layer 22 which is common for all memory cell capacitors C1, C2, . . . , Cn is buried in the bottom of grooves 12 defining separated island cell layer 14 in the same manner as in the first embodiment. The second embodiment is different from the first in that the square-ring-shaped semiconductor layer formed in the lower half of the side wall of each layer 14 to oppose common capacitor electrode 22 is divided into two C-shaped layers 86 and 88. $N^-$-type semiconductor layers 86 and 88 are formed in respective side walls of the lower half of each layer 14, and thus, two cell capacitors C1 and C2 are formed in one layer 14.

Square-ring-shaped $p^-$-type semiconductor layer 90 is formed to surround the side walls of the upper half of each layer 14 and extends between layers 86 and 88 where they approximate in the column direction (i.e., vertical in FIG. 5). Layer 90 serves as a channel for each of two cell transistors Q1 and Q2 in one layer 14. The height of the portion of channel layer 90 above layers 86 and 88 is set to be substantially the same as those of gate electrode layers 80 and 82. One drain layer 32 is formed in the entire top surface region of each layer 14 in the same manner as the first embodiment. More specifically, layer 32 serves as a common drain electrode for two cell transistors Q1 and Q2 formed on both sides of layer 14.

Returning now to FIG. 5, terminal ends of two gate electrode layers 80 and 82 are connected to word lines 96 and 98 through contact holes 92 and 94, respectively. Other configurations of the device in FIG. 5 are the same as in the first embodiment.

According to the second embodiment of the present invention having the above configuration, memory cells of substantially twice the number of the first embodiment can be obtained on substrate 10 in the same area, so that the memory capacity of the dRAM can be doubled. Since the number of layers 14 formed on substrate 10 is unchanged despite this increase in memory capacity, dRAMs can be manufactured at a high yield without requiring special micropatterning techniques. In addition, when the dRAM of the second embodiment is manufactured, field oxide film 84 can be formed after formation of layers 14 on substrate 10 in the step shown in FIG. 4B of the first embodiment. The number of manufacturing steps thus need not be greatly increased, and the configuration of the second embodiment can be enabled with ease.

Although the present invention has been shown and described with reference to particular embodiments, various changes and modifications which are obvious to a person skilled in the art to which the invention pertains are deemed to lie within the scope of the invention.

For example, in the first embodiment, a gate electrode continuous in one direction is formed in a technique which can leave a side wall of a second layer polycrystalline silicon film without masking. This is enabled by decreasing the gap between vertically adjacent island semiconductor layers in FIG. 1 to be smaller than that between horizontally adjacent island semiconductor layers. If grid-like grooves are formed at a constant pitch so that the gaps between the island semiconductor layers are identical in any direction, masking must be performed for arranging gate electrodes continuously in one direction. In this case, the following steps may be adopted. The second layer polycrystalline silicon film is deposited thicker than required when the structure of FIG. 4E is formed. Portions formed by connecting gate electrodes between adjacent island semi-conductor layers are covered by a mask, the second polycrystalline silicon film is etched to a predetermined thickness, the mask is removed, and the film left on the side wall is etched in the same manner as in the first embodiment.

What is claimed is:

1. A manufacturing method of a semiconductor memory device, said method comprising the steps of:
    (a) forming on a semiconductor substrate of a first conductivity type a plurality of island layers having side surface regions and top surface regions which are defined by grooves having bottom surfaces;
    (b) forming a capacitor in a groove surrounding an island layer, said capacitor comprising,
    a capacitor electrode layer which is insulatively provided over the bottom surface of said groove, and
    a semiconductor capacitor layer of a second conductivity type formed in the side surface region of said groove, said semiconductor capacitor layer being formed in said side surface region of said groove to face said capacitor electrode layer; and
    (c) forming a transistor in said island layer, said transistor comprising a gate electrode layer formed in said groove so as to be insulatively stacked over said capacitor electrode layer, said gate electrode layer facing the corresponding side surface region of said island layer.

2. The manufacturing method according to claim 1, wherein the capacitor-forming step comprises the steps of:
    implanting an impurity of the second conductivity type in the surface region of said island layer, thereby forming a first semiconductor layer of the second conductivity type therein to cover at least said side surfaces of said island layer, said first semiconductor layer being divided into two C-shaped layer components which are electrically separated from each other around said island layer, and said C-shaped layer components serving as two semiconductor capacitor layers of two neighbouring cell capacitors; and
    providing a first conductive layer in said groove surrounding said island layer to surround a side surface of substantially a lower half of said island layer, such that substantially an upper half of said island layer is exposed.

3. The manufacturing method according to claim 2, wherein the transistor-forming step comprises the steps of:
    implanting an impurity of the first conductivity type in the exposed upper half of said island layer, thereby forming a second semiconductor layer of the first conductivity type in the exposed surface of said island layer;
    forming a second conductive layer in said groove to surround the side surface of said second semiconductor layer formed in the surface region of the upper half of said island layer such that the top surface of said island layer is exposed, said second conductive layer being devided outside said island layer into two C-shaped layer components serving as two gate electrode layers of two neighbouring cell transistors;
    providing an insulative layer between said two C-shaped layer components; and
    implanting an impurity of the second conductivity type in the exposed top surface region of said island layer, thereby forming a third semiconductor layer which serves as a common drain layer of said two neighbouring cell transistors to cover said top surface of said island layer.

4. The manufacturing method according to claim 1, wherein said capacitor is formed by:
    implanting an impurity of the second conductivity type in the surface region of said island layer, thereby forming a first semiconductor layer of the second conductivity type corresponding to said semiconductor capacitor layer in the surface region of said island layer to cover at least side surfaces thereof; and
    providing a first conductive layer corresponding to said capacitor electrode layer in said groove surrounding said island layer to surround side surfaces of substantially a lower half of said island layer, such that substantially an upper half of said island layer is exposed.

5. The manufacturing method according to claim 4, wherein said transistor is formed by:
- implanting an impurity of the first conductivity type in the exposed upper half of said island layer, thereby forming, on the exposed surface of said island layer, a second semiconductor layer of the first conductivity type which serves as a channel region of said transistor;
- forming a second conductive layer in said groove to surround side surfaces of said second semiconductor layer formed in the surface region of the upper half of said island layer; and
- implanting an impurity of the second conductivity type in the top surface of said island layer, thereby forming a third semiconductor layer which serves as a drain layer of said transistor to cover the top surface of said island layer.

6. A method for manufacturing a semiconductor device, comprising the steps of:
- forming in a surface of a semiconductor substrate intersecting grooves which define a plurality of island portions each of which has a straight vertical sidewall and a top surface region between said intersecting grooves, said grooves having a bottom surface; and
- forming an array of memory cells in the surface of said substrate, and each of which comprises,
  (i) a capacitor formed in a groove surrounding a lower part of the island portion, and comprising a capacitor electrode layer insulatively provided over a bottom surface of said groove, and
  (ii) a transistor comprising a gate electrode layer formed in said grooves so as to surround an upper part of said island portion; and
- connecting in common to a word line gate electrodes of transistors at a selected island portion included in said cell array.

7. The method according to claim 6, comprising:
- forming electrodes so as to be self-aligned with said island portions, and
- forming the gate electrodes of the transistors of adjacent memory cells in direct contact with each other at the sidewall surfaces thereof.

8. The method according to claim 6, comprising:
- forming said selected island portions each to have a transistor having an inverted envelope-shaped gate electrode covering a top surface of the corresponding island portion, and
- connecting said word line to said gate electrode of said selected island portion.

9. The method according to claim 8, where said selected island portion is a final island portion located at a side of said cell array.

10. A manufacturing method of a semiconductor device, comprising the steps of:
- forming, in a surface of a semiconductor substrate, intersecting grooves which define a plurality of island portions each of which has a straight vertical sidewall and a top surface region between said intersecting grooves, said grooves having a bottom surface;
- forming capacitors in said grooves surrounding a lower part of plural of the island portions, said capacitors having a capacitor electrode layer insulatively provided over a bottom surface of said grooves; and
- forming transistors each having a gate electrode layer formed in said grooves so as to surround an upper part of a respective of said plural island portions, said gate electrodes being self-aligned with said island portions, wherein the transistor and capacitor surrounding the same island portion define a memory cell and the gate electrodes of the transistors of adjacent memory cells are so formed as to be in direct contact with each other at the sidewall surfaces thereof.

11. The method according to claim 10, comprising:
- forming said adjacent memory cells to have a square planar shape when viewed from above the memory cells.

12. The method according to claim 10, comprising:
- forming cells included in said cell array to include two neighboring cells of square planar shape having corner edges which are in direct contact with each other at which point the gate electrodes of transistors of said two neighboring cells are in direct contact with each other.

13. The method according to claim 10, comprising:
- forming island portions with a side wall which has a straight vertical side surface.

14. The method according to claim 10, further comprising:
- forming an insulative layer longitudinally in said cell array in such a manner that said cell array is divided into two cell arrays which are electrically isolated from each other and serve as independent cell arrays, whereby the integration density of said memory device is doubled.

15. The method according to claim 10, comprising:
- connecting in common the gate electrodes of plural of said transistors included in said cell array to a word line at a selected island portion included in said cell array.

16. The method according to claim 15,
- forming said selected island portion to have a transistor which has an inverted envelope-shaped gate electrode covering a top surface of the corresponding island portion, said word line being connected to said gate electrode of the transistor of said selected island portion.

17. The method according to claim 16, wherein said selected island portion is a final island portion located at a side of said cell array.

18. The method according to claim 10, wherein said step of forming said capacitors comprises:
- forming a first semiconductor layer in sidewalls of said grooves so as to face said capacitor electrode layer.

19. The method according to claim 10, wherein said step of forming said transistors comprises:
- forming a second semiconductor layer serving as a drain layer of said transistors on said top surface regions of said plural island portions; and
- forming a third semiconductor layer on said side surface regions of said island portion so as to serve as channel regions of said transistors.

20. The method according to claim 19, comprising:
- forming semiconductor layer to cover said top surface regions of said island portions.

21. The method according to claim 20, comprising:
- forming said first semiconductor layer and said gate electrode layer in a square-shaped manner to surround said side surfaces of said island portions, thereby providing one cell transistor and one cell capacitor in each island portions.

22. The method according to claim 20, comprising:

dividing said semiconductor layer into two C-shaped layer components which are electrically separated from each other, thereby providing two cell capacitors in each island portion.

23. The method according to claim 22, comprising: dividing said gate electrode layer outside said island portions into two C-shaped layer components which are electrically separated from each other, thereby providing two cell transistors in each island portion.

* * * * *